(12) United States Patent
Butler et al.

(10) Patent No.: US 6,798,229 B2
(45) Date of Patent: Sep. 28, 2004

(54) WIDE-BANDWIDTH COAXIAL PROBE

(76) Inventors: Brian D. Butler, 4208 Balloon Park Rd. NE., Albuquerque, NM (US) 87109; Stephen M. Tobin, 89 Channing Rd., Watertown, MA (US) 02472

( * ) Notice: Subject to any disclaimer, the term of this patent is extended or adjusted under 35 U.S.C. 154(b) by 50 days.

(21) Appl. No.: 09/853,856

(22) Filed: May 10, 2001

(65) Prior Publication Data

US 2003/0102876 A1 Jun. 5, 2003

Related U.S. Application Data

(63) Continuation-in-part of application No. 09/738,044, filed on Dec. 15, 2000, now Pat. No. 6,759,853.
(60) Provisional application No. 60/203,501, filed on May 11, 2000.

(51) Int. Cl.[7] ............................................. G01R 31/02
(52) U.S. Cl. ..................................... 324/761; 324/754
(58) Field of Search .............................. 324/754, 757, 324/761, 72.5

(56) References Cited

U.S. PATENT DOCUMENTS

| | | | |
|---|---|---|---|
| 4,055,805 A | 10/1977 | Ardezzone | 324/158 P |
| 4,116,523 A | 9/1978 | Coberly et al. | 339/108 TP |
| 4,138,643 A * | 2/1979 | Beck et al. | 324/754 |
| 4,593,243 A | 6/1986 | Lao et al. | 324/158 P |
| 4,593,820 A | 6/1986 | Antonie et al. | 209/573 |
| 4,628,464 A | 12/1986 | McConnell | 364/513 |
| 4,686,463 A | 8/1987 | Logan | 324/158 P |
| 4,739,259 A * | 4/1988 | Hadwin et al. | 324/761 |
| 4,740,746 A | 4/1988 | Pollock et al. | 324/158 P |
| 4,743,839 A | 5/1988 | Rush | 324/72.5 |
| 4,829,242 A | 5/1989 | Carey et al. | 324/158 P |
| 4,881,863 A | 11/1989 | Braginsky | 414/225 |
| 4,923,407 A * | 5/1990 | Rice et al. | 439/92 |
| 5,043,910 A | 8/1991 | Chiba | 364/489 |
| 5,105,147 A | 4/1992 | Karasikov et al. | 324/158 P |
| 5,264,788 A * | 11/1993 | Smith et al. | 324/754 |
| 5,291,129 A * | 3/1994 | Kazama | 324/757 |
| 5,394,348 A | 2/1995 | Abe | 364/580 |
| 5,469,064 A | 11/1995 | Kershner et al. | 324/537 |
| 5,477,159 A | 12/1995 | Hamling | 324/754 |
| 5,498,964 A | 3/1996 | Kershner et al. | 324/530 |
| 5,498,965 A | 3/1996 | Mellitz | 324/532 |
| 5,506,515 A | 4/1996 | Godshalk et al. | 324/762 |
| 5,565,788 A | 10/1996 | Burr et al. | 324/762 |
| 5,631,856 A | 5/1997 | Keller et al. | 364/578 |
| 5,696,450 A | 12/1997 | Itoh | 324/537 |
| 5,781,021 A | 7/1998 | Ilani | 324/754 |
| 5,844,412 A | 12/1998 | Norton | 324/548 |
| 5,959,460 A | 9/1999 | Johnson | 324/762 |
| 5,982,187 A * | 11/1999 | Tarzwell | 324/756 |
| 5,994,909 A | 11/1999 | Lucas et al. | 324/754 |
| 6,024,526 A | 2/2000 | Slocum et al. | 414/226.01 |
| 6,051,978 A | 4/2000 | Swart | 324/537 |
| 6,276,956 B1 * | 8/2001 | Cook | 439/482 |

\* cited by examiner

Primary Examiner—Kamand Cuneo
Assistant Examiner—Paresh Patel
(74) Attorney, Agent, or Firm—Dennis F. Armijo

(57) ABSTRACT

A coaxial probe for testing of planar electric transmission line structures comprising: a probe mount comprising a coaxial connector; a center electrode mounted on the probe mount and electrically connected to a center conductor of the coaxial connector, wherein the center conductor may be placed in contact with a first point on a planar electric transmission line structure to be tested; an outer electrode mounted on the probe mount and electrically connected to ground, the outer electrode comprising a protrusion to be placed in contact with a second point on the planar electric transmission line structure to be tested; and a dielectric of non-uniform thickness between the center and the outer electrodes.

28 Claims, 15 Drawing Sheets

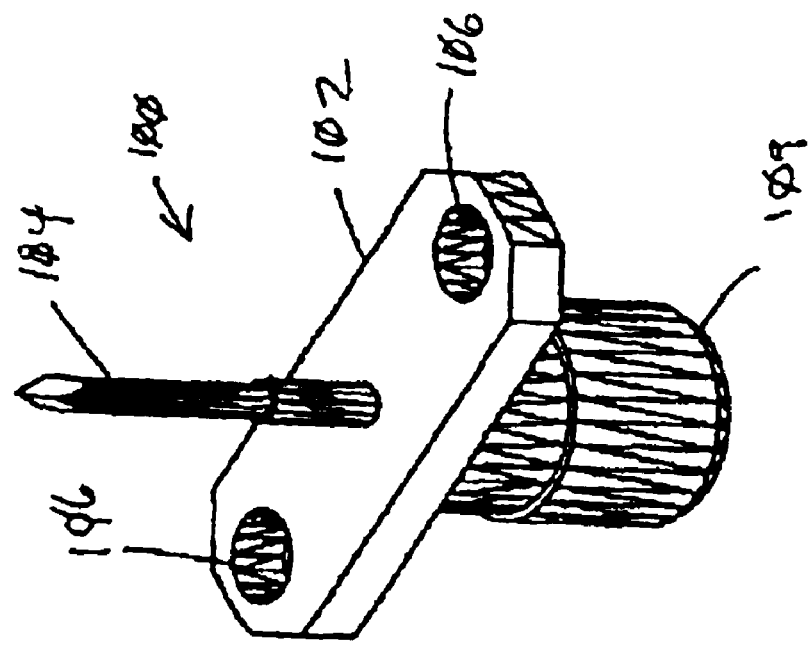
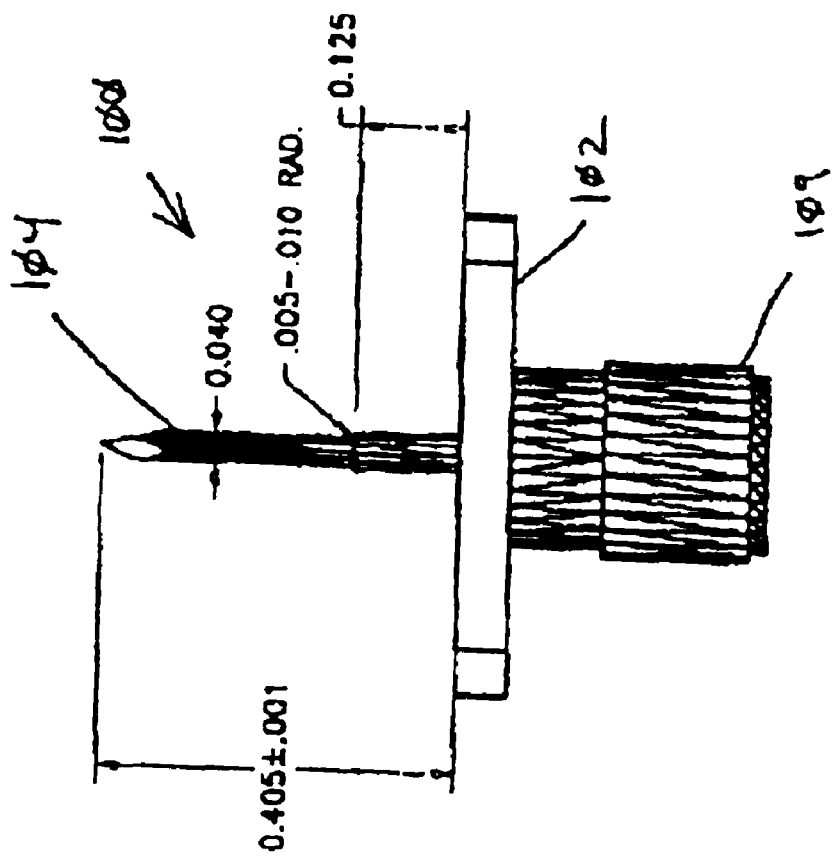

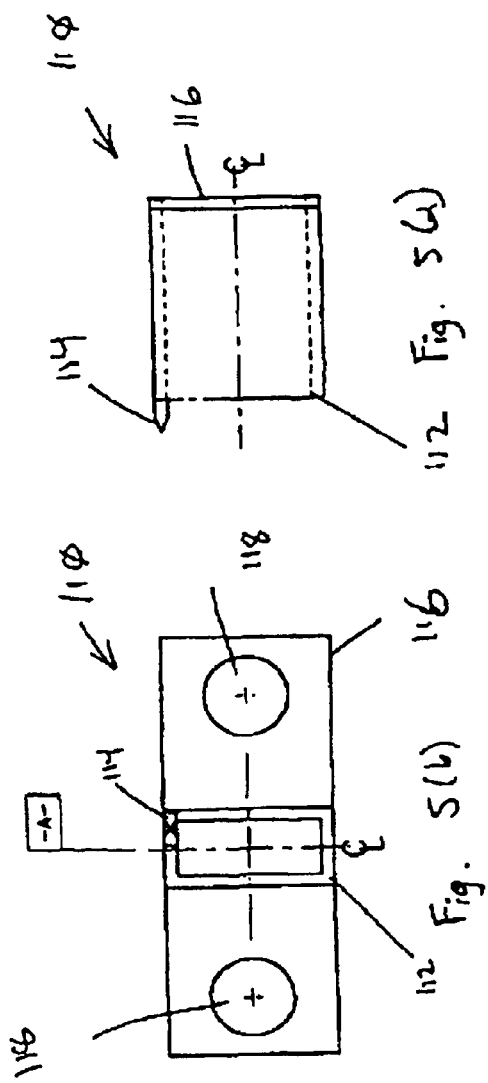

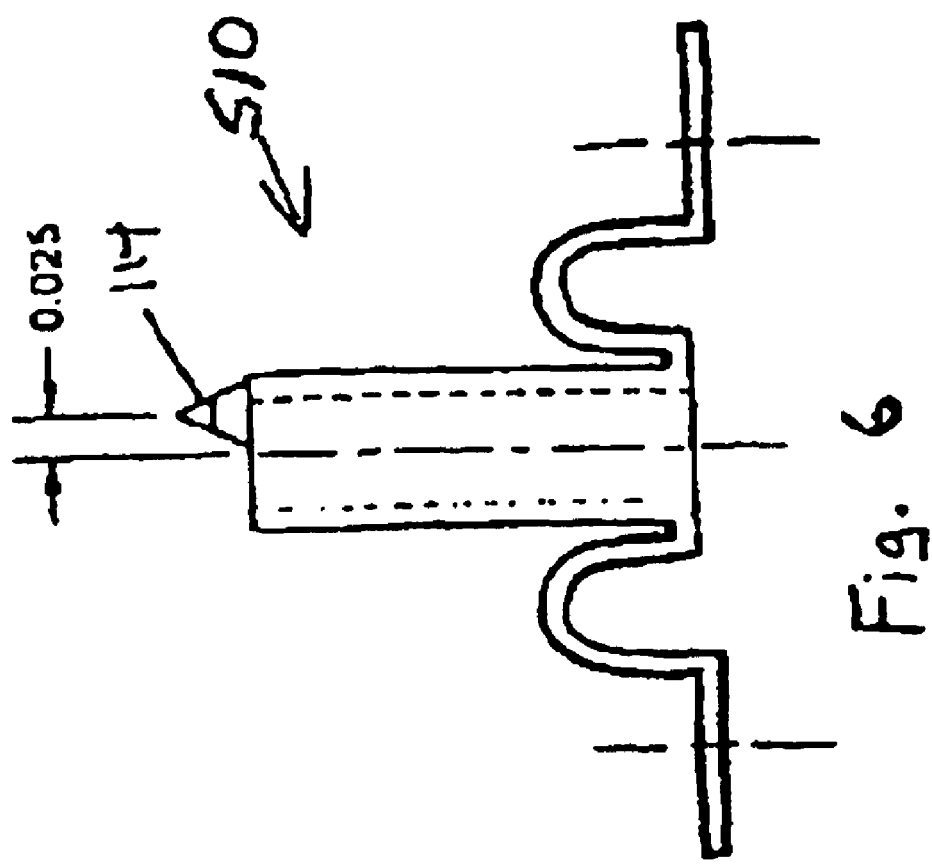

WIDE-BANDWIDTH COAXIAL PROBE

CROSS-REFERENCE TO RELATED APPLICATIONS

This application is a continuation-in-part application of U.S. patent application Ser. No. 09/738,044, entitled "Automated Domain Reflectometry Testing System", to Brian D. Butler, filed on Dec. 15, 2000 now U.S. Pat. No. 6,758,853, and the specification thereof is incorporated herein by reference.

This application claims the benefit of the filing of U.S. Provisional Patent Application Serial No. 60/203,501, entitled "Wide-Bandwidth Coaxial Probe for Automated Testing of Planar Transmission Line Structures", to Brian D. Butler and Stephen M. Tobin, filed on May 11, 2000, and the specification thereof is incorporated herein by reference.

BACKGROUND OF THE INVENTION

1. Field of the Invention (Technical Field)

The present invention relates to probes for time domain reflectometry testing of electrical components.

2. Background Art

Note that the following discussion refers to a number of publications by author(s) and year of publication, and that due to recent publication dates certain publications are not to be considered as prior art vis-a-vis the present invention. Discussion of such publications herein is given for more complete background and is not to be construed as an admission that such publications are prior art for patentability determination purposes.

The complexity of electronic components, particularly printed circuit boards, is steadily increasing, as is the demand for electronic components. These components need to be tested for faults, and high frequency test techniques such as time domain reflectometry provides one technique for much of such testing. Because of the high volume of needed testing, automated robotic systems are preferred in order to attain a high throughput for any testing system.

Time domain reflectometry (TDR) is a technique for detecting impedance mismatches and other characteristics of microwave transmission lines. A very fast (order 50 ps) rising edge is injected, via electric probe onto the line, and line characteristics such as characteristic impedance and propagation delay are calculated from the step response recorded on a digital storage oscilloscope (DSO). With the advent of fast bus structures in computer memory applications such as RAMBUS, traces on printed circuit boards (PCBs) must now be treated as distributed circuits or transmission lines. As a result, computer memory and backplane manufacturers are now being asked by memory bus and integrated circuit designers to control the characteristic impedance of PCB traces.

Unfortunately, existing time domain reflectometry robotic testing systems suffer from noise introduced by certain sources of imprecision in the systems themselves. For example, U.S. Pat. No. 5,994,909, to Lucas et al., discloses a robotic testing system having two probes 122,123 mounted on a single robotic arm wherein probe 123 is adjustable so that the distance between the two probes is adjustable. Such a mechanical system is prone to imprecision over time, because of vibration, temperature fluctuations, and like sources of distortion. Similarly, European Patent Application EP 0 953 844 A2 (corresponding to U.S. Pat. No. 6,051,978, to Swart) discloses a two-probe system but having a single probe on each of two robotic arms. Again, maintaining a precise desired distance between the two probes is difficult, again resulting is unwanted distortion of the testing results. Because of such imprecisions in existing systems, the shortest traces that can be tested accurately are those that are 1.5 inches or longer.

The present invention greatly increases precision in domain reflectometry systems by employing twin probes (signal and ground) having a fixed distance (pitch) between them and having certain other desirable electrical characteristics. Because testing often requires a number of different pitches, a robotic arm employing the invention is preferably able to select any of a plurality of fixed-pitch probes stored in a probe tip changer assembly, as disclosed in U.S. patent application Ser. No. 09/738,044. Because this prevents inaccuracies induced by changes in pitch over time plaguing prior art mechanical systems, the present invention is able to successfully test traces as short as 0.5 inches. The shapes of the probe tips and the preferred rectangular shape of the probe tip assembly preserve accuracy by precisely matching the electrical characteristics of circular coaxial structures such as coaxial cables. The present invention has a number of other advantages over the prior art as discussed below.

U.S. Pat. No. 4,740,746, to Pollock et al., discloses a controlled impedance microcircuit probe with a resilient center electrode in which impedance control is provide by maintaining a constant thickness of a dielectric between the center and the outer probe. The present invention does not have such limitation because air is used as a dielectric medium. Pollock et al.'s probe is also disadvantageous in that the compliance of the center electrode, provided by a multi-turn coiled spring, adds inductance to the ground circuit, thereby slowing the response time of the probe.

The following references disclose other electronic device probes having varying advantages and disadvantages: U.S. Pat. No. 5,959,460, to Johnson; U.S. Pat. No. 5,565,788, to Burr et al.; U.S. Pat. No. 5,506,515, to Godshalk et al.; U.S. Pat. No. 5,477,159, to Hamling; U.S. Pat. No. 4,829,242, to Carey et al.; U.S. Pat. No. 4,743,839, to Rush; U.S. Pat. No. 4,686,463, to Logan; U.S. Pat. No. 4,593,243, to Lao et al.; U.S. Pat. No. 4,116,523, to Coberly et al.; and U.S. Pat. No. 4,055,805, to Ardezzone. The following references disclose robotic testing systems having varying advantages and disadvantages: U.S. Pat. No. 6,008,636, to Miller et al.; U.S. Pat. No. 5,781,021, to Ifani; U.S. Pat. No. 5,498,965, to Mellitz; U.S. Pat. No. 6,024,526, to Slocum et al.; U.S. Pat. No. 5,844,412, to Norton; U.S. Pat. No. 5,696,450, to Itoh; U.S. Pat. No. 5,498,964, to Kerschner et al.; U.S. Pat. No. 5,469,064, to Kerschner et al.; U.S. Pat. No. 5,105,147, to Karasikov et al.; U.S. Pat. No. 4,881,863, to Braginsky; U.S. Pat. No. 5,631,856, to Keller et al.; U.S. Pat. No. 5,394,348, to Abe; U.S. Pat. No. 5,043,910, to Chiba; U.S. Pat. No. 4,628,464, to McConnell; and U.S. Pat. No. 4,593,820, to Antonie et al.

SUMMARY OF THE INVENTION (DISCLOSURE OF THE INVENTION)

The present invention is of a coaxial probe for testing of planar electric transmission line structures comprising: a probe mount comprising a coaxial connector; a center electrode mounted on the probe mount and electrically connected to a center conductor of the coaxial connector, wherein the center conductor may be placed in contact with a first point on a planar electric transmission line structure to be tested; an outer electrode mounted on the probe mount and electrically connected to ground, the outer electrode comprising a protrusion to be placed in contact with a second point on the planar electric transmission line structure to be tested; and a dielectric of non-uniform thickness between the center and the outer electrodes. In the preferred embodiment, the probe mount comprises a conductive plate and the dielectric comprises air. If the probe mount comprises a printed circuit board, the dielectric comprises the printed circuit board and air, and the printed circuit board may comprise one or more stubs for tuning electrical characteristics of the probe, and one or more shorting bars located along the one or more stubs. The outer electrode preferably comprises a conductive tube having a non-circular cross-section, such as oval, square, rectangular, hexagonal, L-shaped, or U-shaped. The protrusion may be placed at any point on a downward-facing surface of the outer electrode without substantially altering impedance characteristics of the probe. The pitch between the center electrode and the protrusion is preferably fixed. The protrusion preferably comprises a 60-degree point. The outer electrode may be axially spring-loaded to provide compliance. The connector may be spring-loaded to provide compliance, preferably via a short-throw conductive spring. The probe can be constructed to be handheld during testing of the planar electric transmission line structure. Impedance characteristics of the probe substantially match those of a coaxial cable attached to the connector. Lumped series resistance (such as a resistor) may be attached to the outer electrode to increase speed of the probe.

The invention is also of a differential coaxial probe assembly comprising two probes as described in the preceding paragraph.

The invention is additionally of a coaxial probe for testing of planar electric transmission line structures comprising: a probe mount; a center electrode mounted on the probe mount, wherein the center conductor may be placed in contact with a first point on a planar electric transmission line structure to be tested; and an outer electrode of non-circular cross-section mounted on the probe mount. In the preferred embodiment, the outer electrode comprises a protrusion to be placed in contact with a second point on the planar electric transmission line structure to be tested. The protrusion may be placed at any point on a downward-facing surface of the outer electrode without substantially altering impedance characteristics of the probe.

The invention is also of a differential coaxial probe assembly comprising two probes as described in the preceding paragraph, with fixed relative positions, with manually variable relative positions, or with automatically variable relative positions, and with either zero or one protrusion on a downward facing surface of each of the outer electrodes.

The invention is yet further of a coupled line differential probe assembly comprising: a probe mount; two center electrodes mounted on the probe mount, wherein both of the center conductors may simultaneously be placed in contact with first and second points on a planar electric transmission line structure to be tested; and an outer electrode of non-circular cross-section mounted on the probe mount, the outer electrode comprising zero, one, or two protrusions to be placed in contact with additional points on the planar electric transmission line structure to be tested. In the preferred embodiment, the protrusions may be placed at any point on a downward-facing surface of the outer electrode without substantially altering impedance characteristics of the probe. The outer electrode can comprise one protrusion to be placed in contact with a third point on the planar electric transmission line structure to be tested, or zero protrusions whereby a common ground is not provided between said outer electrode and the planar electric transmission line structure to be tested.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings:

FIGS. 4(a)–(e) are side and perspective views of the preferred signal electrode assembly of the present invention, and side, front, and top views of the preferred signal electrode tip of the present invention;

FIGS. 5(a)–(d) are perspective, top, and two cross-section views of the preferred ground electrode assembly of the present invention used in conjunction with the signal probe assembly of FIGS. 4(a)–(d);

FIG. 6 shows an embodiment with an axially spring-loaded outer conductor for compliance;

DESCRIPTION OF THE PREFERRED EMBODIMENTS (BEST MODES FOR CARRYING OUT THE INVENTION)

The present invention is of an improved probe for time domain reflectometry testing of planar transmission line structures. A mount, such as a conductive plate (employing air as a dielectric) or printed circuit board (employing the PCB as the dielectric), is used to mount the probe structure. A miniature microwave connector jack (typically SMA or 3.5 mm) is attached to the probe mount and is used as the interface to a piece of coaxial cable leading to a digital storage oscilloscope (DSO) or other test control/monitoring device. On the opposite side of the probe mount from the connector jack, two electrodes (or more) are attached to the probe mount in a coaxial arrangement. The center electrode is preferably a round, solid metal pin of high electrical conductivity (e.g., gold-plated brass, gold-plated beryllium copper, or gold-plated phosphor bronze). The outer electrode is preferably a metal tube, which is preferably oval, square, rectangular, hexagonal, L-shaped, or U-shaped of high electrical conductivity (e.g., gold-plated brass). Other configurations, including circular, are possible. A small protrusion is formed (e.g., machined, clipped, soldered, or otherwise attached) onto the outer electrode such that the distance from the center of the center conductor to the center of the protrusion is equal to the pitch of the PCB features to be probed.

The electrode dimensions are arranged so as to match the characteristic impedance of the cable, connector jack and connector jack-to-mount interface located in and on the opposite side of the probe mount. Such an impedance match is essential for optimum functioning of the invention. One of ordinary skill in the art can, for any desired combination of electrode materials, outer electrode shape, pitch between center and outer electrodes, etc., configure a probe according to the invention that will have such an impedance match. Most preferably, the outer electrode is configured such that the ground protrusion (nib) may be placed at any point on the downward facing surface of the electrode without affecting the impedance characteristics of the probe. The length of the protrusion is sufficiently short (<1/10 of the equivalent signal wavelength) such that any tip-to-ground impedance mismatch will not appreciably affect measurement precision.

The probe components are preferably mounted to a conductive metal plate that provides rigidity. The plate can also provide the weight (force) required for necessary electrical contact between probe tip ends and PCB features to be probed. The metal plate preferably contains two or more linear ball bearings (or brass bushings or plastic bushings) for ease of axial movement when mounted as the end tool of a robotic work cell. The metal block can be connected to an earth ground (such as being common with the case of the connector) to provide isolation from outside electrical interference.

Figure 1:
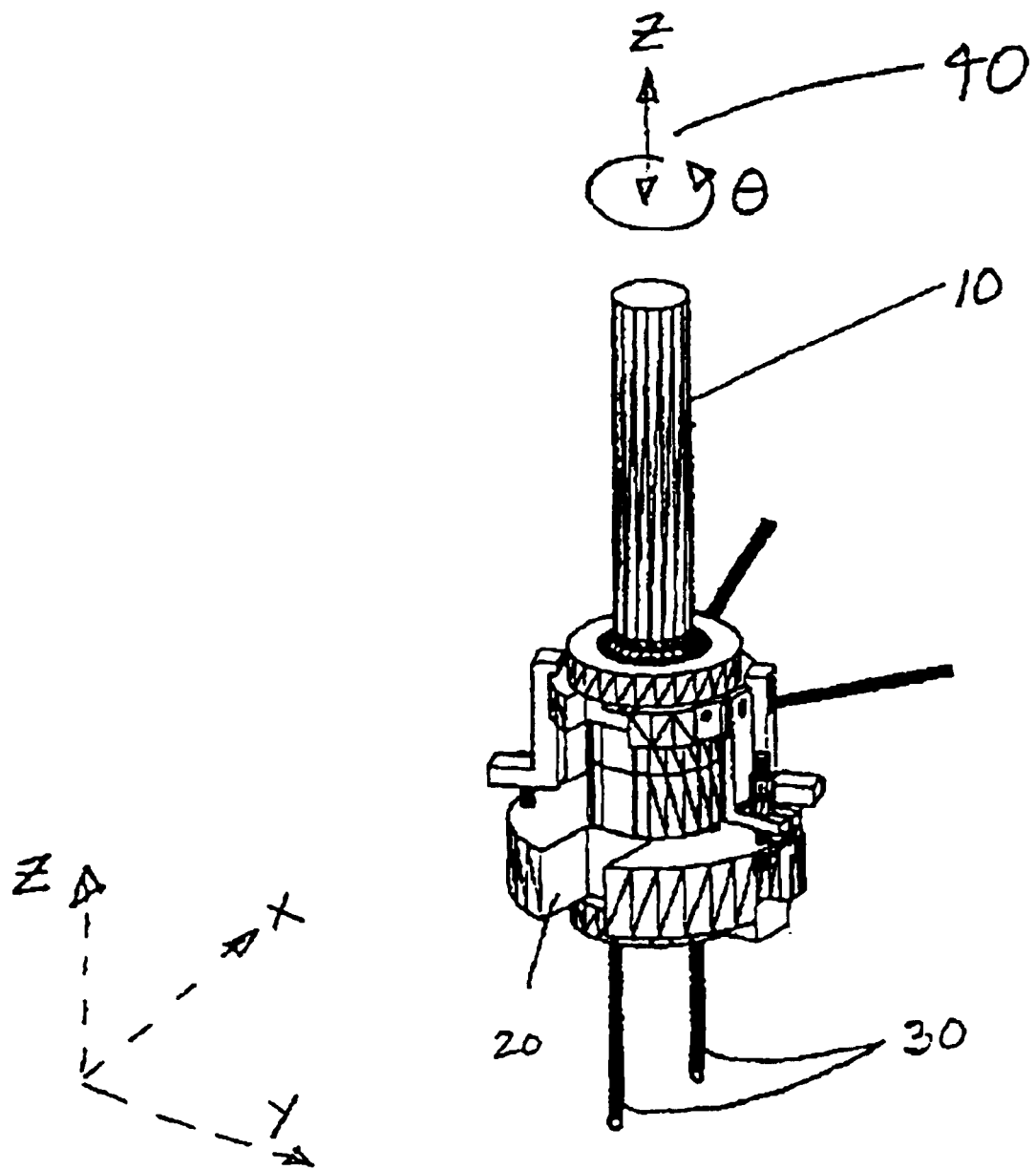
FIG. 1 is a perspective view of the probe of a robotic arm and tool changer assembly onto which the probe of the invention is mounted in one embodiment.
Figure 2:
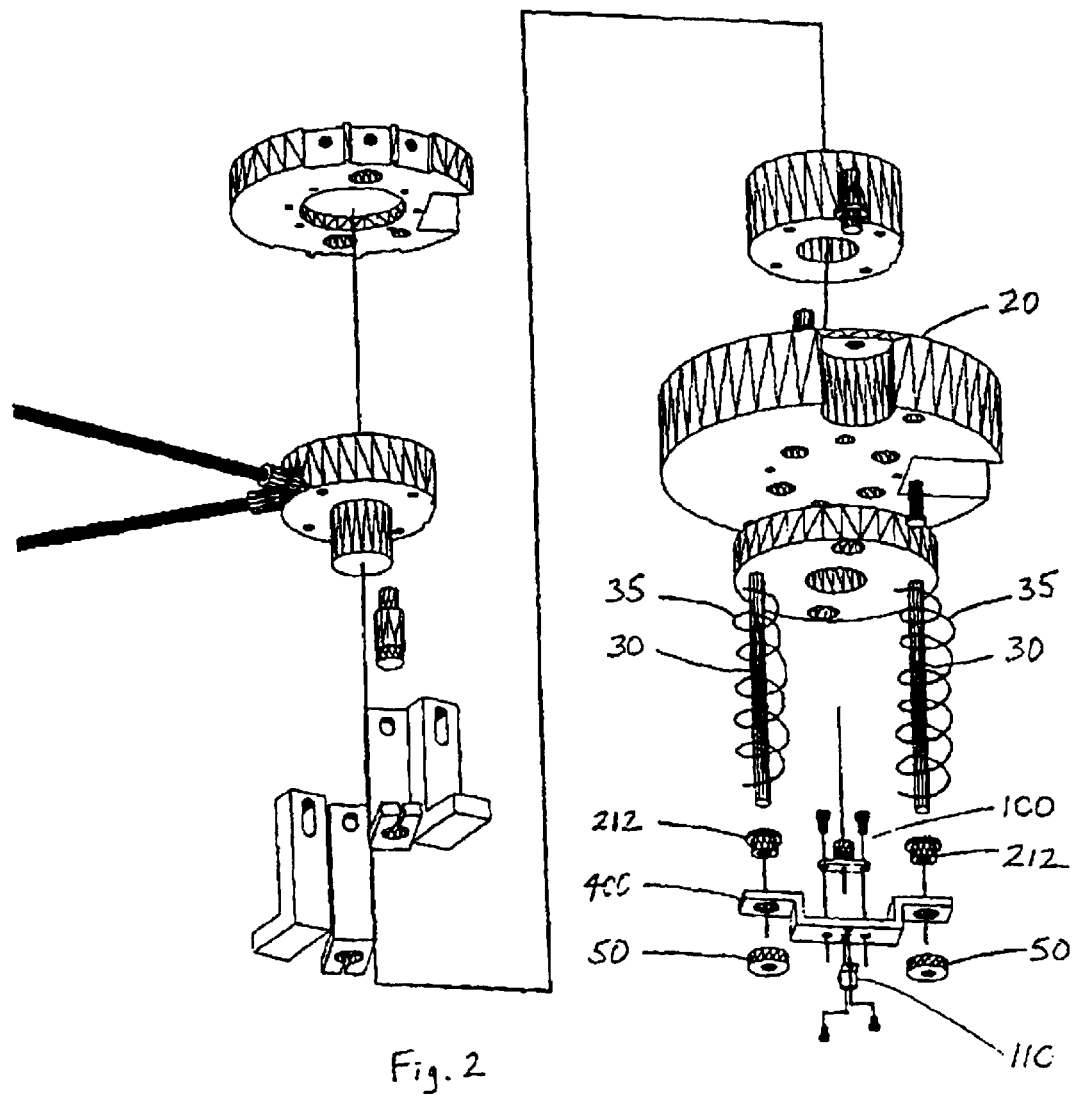
FIG. 2 is an exploded view of the probe of the invention, comprising a probe tip assembly and a ground electrode assembly, and showing a tool changer assembly attached to the probe of the invention via rigid shafts and sliding bushings.

FIG. 1 illustrates the robotic arm 10 onto which the preferred probe would be mounted. Robotic arm 10 may move in degrees of freedom as indicated by arrows 40. in addition to independent placement in the x-y plane. A plurality of probe changer assemblies 20 may be engaged to and disengaged from robotic arm 10 repeatedly as required. Mounted permanently to probe changer assembly 20 are two or more rigid shafts 30, onto which the preferred probe would be installed and permitted to slide by means of low-friction bushings. FIG. 2 illustrates the preferred probe of the invention, comprising signal probe tip assembly 100, ground electrode assembly 110, probe bracket 400, sliding non-conductive bushings 212, mounting collars 50, and tool changer assembly 20 attached to the probe via compression springs 35 and rigid shafts 30.

Figure 3:
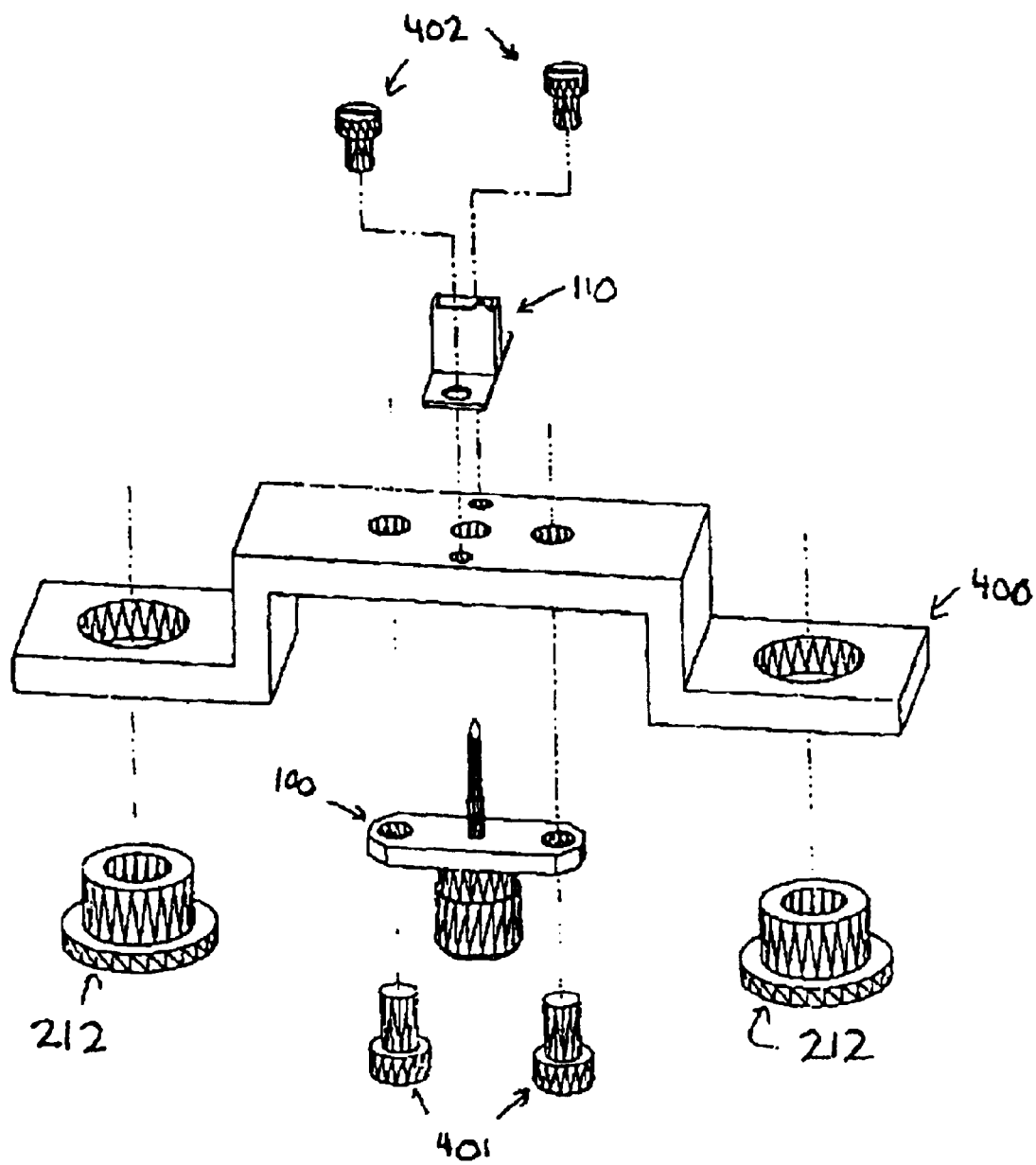
FIG. 3 is an exploded view of the preferred probe assembly of the invention, wherein a center conductor of an SMA jack forms the signal electrode.

The components of the preferred probe tip assemblies of the invention are shown in FIGS. 3, 4(a)–(e), and 5(a)–(d) which show the preferred but illustrative dimensions. FIG. 3 shows the components of the probe tip assembly which is comprised of the following: signal probe tip assembly 100 with two brass mounting screws 401; ground electrode assembly 110 (preferably made of brass) with two brass mounting screws 402; probe assembly body bracket 400 (preferably made of brass); and two non-conductive bushings 212.

Figure 4E:
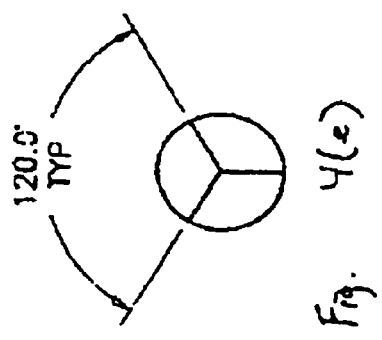
Figure 4D:
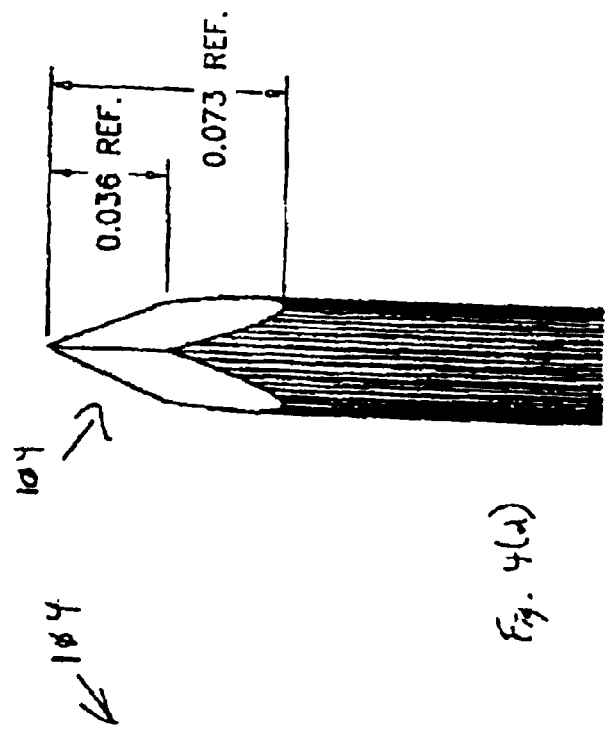
Figure 4C:
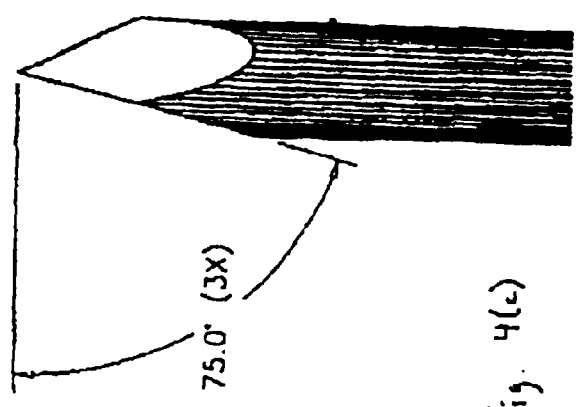
Figure 5A:
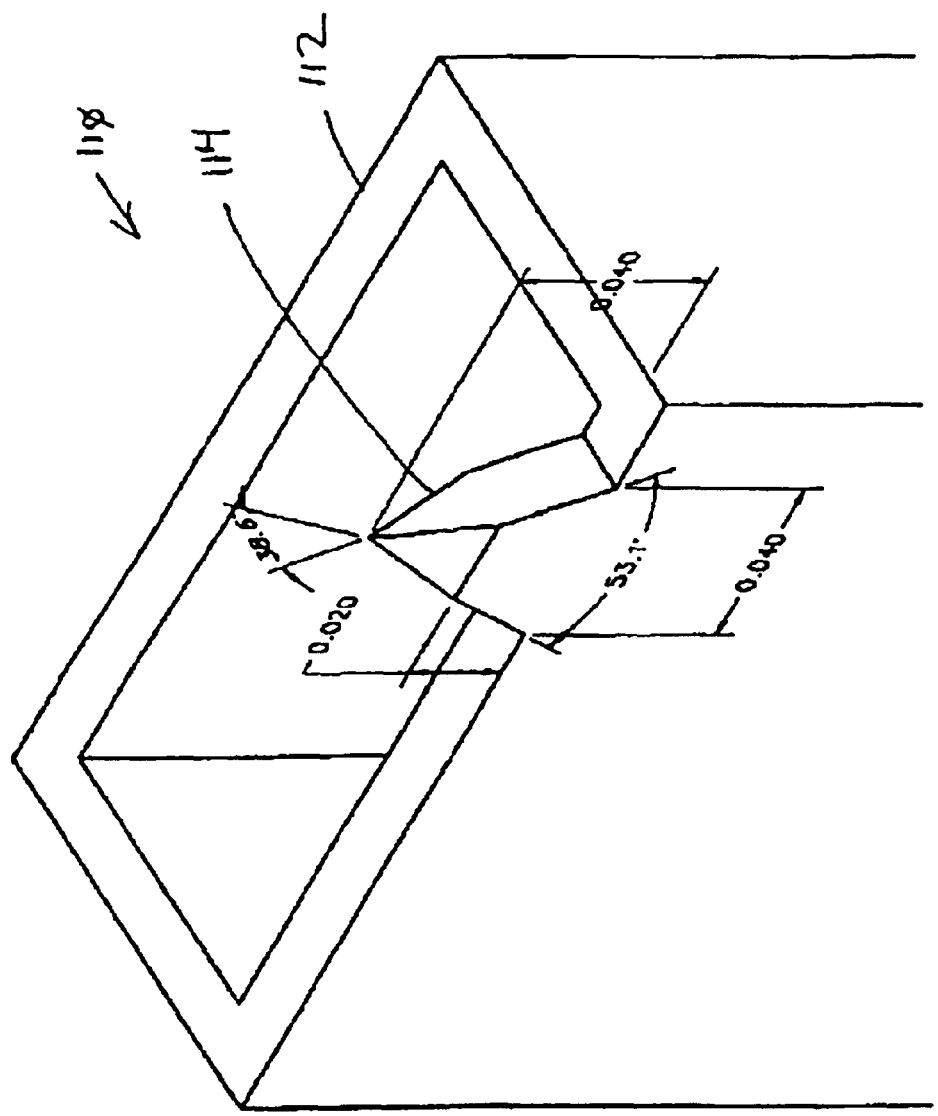

FIGS. 4(a) and (b) show the preferred signal probe tip assembly 100, comprising a coaxial cable interface 109 which mates with a corresponding connector electrically connected back through the robotic arm to the testing instrumentation by coaxial cable and male/female connectors. The coaxial connector's ground is electrically connected to the ground flange 102, and with the probe assembly body bracket 400 through physical connection and through the two brass mounting screws 401 and thus with ground electrode assembly 110 through its mounting onto the probe assembly body bracket 400 with the two brass mounting screws 402. The coaxial connector's signal is electrically connected with signal probe tip 104, which is insulated from the ground flange 102. The probe assembly body bracket 400, has support holes which can be engaged by non-conductive bushings 212 to physically support the probe tip assembly. The preferred shape of signal probe tip 104 is shown in FIGS. 4(c)–(e).

Turning now to FIGS. 5(a)–(d), these show a rectangular ground electrode assembly 110, which in use is physically connected with the probe assembly body bracket 400 such that base plate 116 is physically and electrically connected to probe assembly body bracket 400, creating a conductive ground path through sleeve 112 to ground nib/tip 114. The dimensions of the assemblies 100 and 110 are arranged so that both nib 114 and signal probe tip 104 preferably protrude from sleeve 112 by the same distance. A 60-degree point is preferred for the ground nib. Alternatively, signal probe tip 104 can be longer in order to permit it to be compliant when contacting a board under test.

Assemblies 100 and 110 are configured so that by placing the nib 114 at any point on sleeve 112, the electrical impedance of the combined assembly is such that a coaxial cable structure is sufficiently matched despite changes in distance (pitch) between nib 114 and signal probe tip 104. Preferably, the conductive portions of the assemblies are composed of a copper-based alloy.

Figure 7:
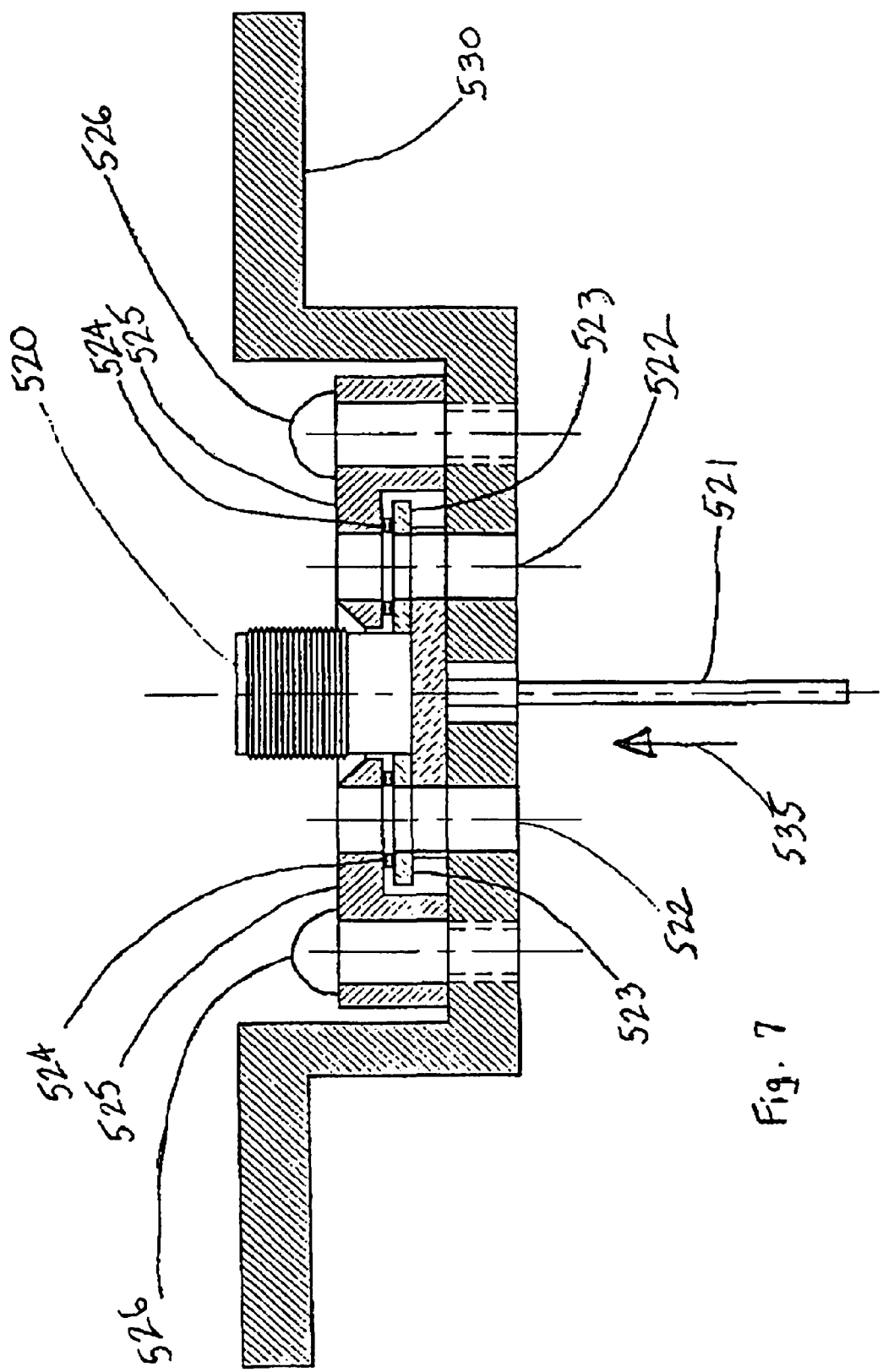
FIG. 7 shows an embodiment with an axially spring-loaded SMA jack for compliance.

In order to overcome the difficulties inherent in making the signal and ground electrodes exactly the same length, as shown in FIG. 6, an outer electrode 510 can be configured as an axially spring-loaded conductor member in order to provide compliance. Alternatively, as shown in FIG. 7, the probe may be configured such that the entire connector assembly 520 is resilient rather than a single conductor. This results in movement of the signal electrode 521 instead of the ground electrode (not shown). Compliance is provided by having connector assembly 520 move along metal pins 522 in the upward direction as indicated by the arrow 535, while contacting conductive washers 523 and short-throw wave washer tyne springs 524. Movement is limited by conductive stops 525 attached to base bracket 530 by conductive mounting screws 526. Short-throw wave washer type springs 524 are preferred in that these lessen the introduction of excess inductance into the system.

Figure 8:
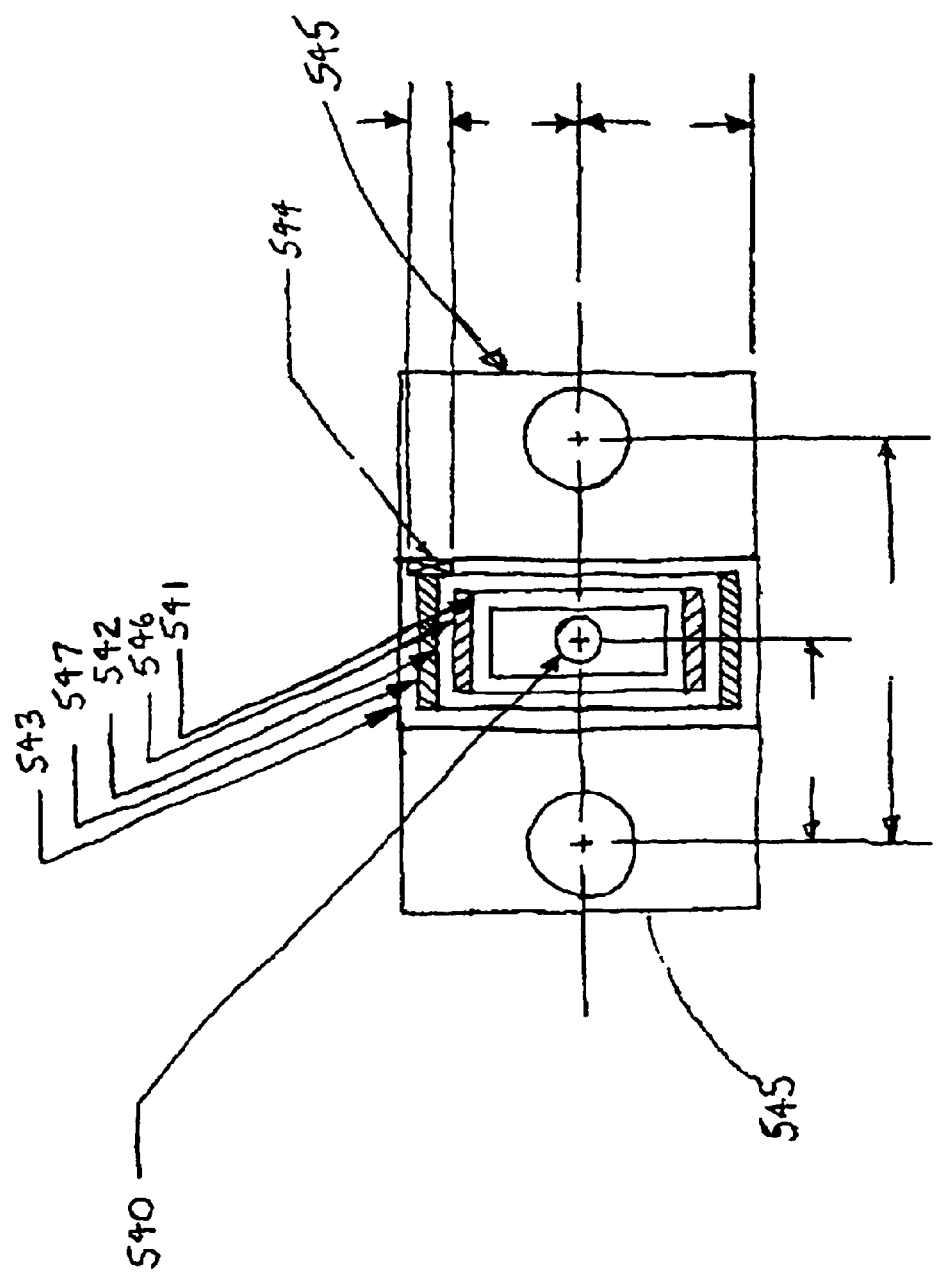
FIG. 8 shows an embodiment with three nested outer conductors to extend the pitch of the probe.

The pitch range of the probe can be extended by nesting one or more larger outer electrodes of tubular construction over the first outer electrode and attaching (e.g., soldering or otherwise adhering) the two electrodes together to form a firm electrical contact. If air space exists between the two electrodes, the air space can be filled with pieces of high-conductivity material of appropriate dimensions and attached (e.g., soldered or otherwise adhered) to the electrode assembly. As shown in FIG. 8, the center electrode 540 is surrounded by an inner tube 541, intermediate tube 542 and outer electrode 543, configured with ground nib 544 and mounting flanges 545. Air spaces are filled by plate pairs 546 and 547. The impedance match previously described is preserved by retaining inner tube size and shape 541 as shown in FIGS. 5(a) to (d).

Figure 9:
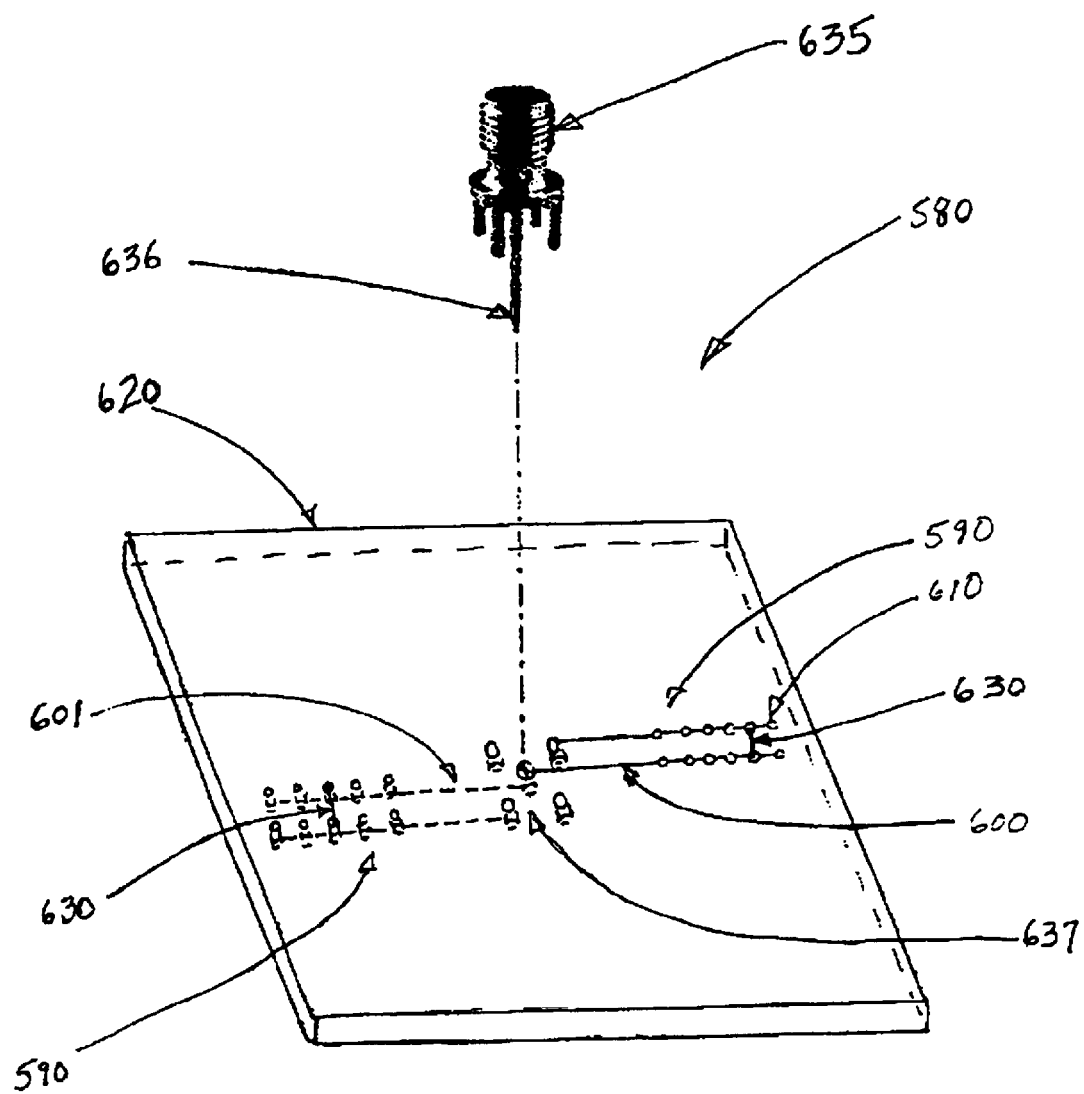
FIG. 9 shows a double-stub tunable coaxial probe assembly according to the invention.

FIG. 9 illustrates a double-stub tuned passive coaxial probe assembly 580 for a more precise impedance matching of probe to SMA jack and cable, embodied by locating stubs 590 as traces 600 and pads 610 (holes) on both sides of the probe PCB mount 620. Dashed traces 601 are indicated as being on the back side (bottom) of the PCB. Shorting bars 630 are soldered in place at specific locations along both of the stubs to provide the necessary tuning function. In this case SMA jack assembly 635 with an extended center electrode 636 is soldered into holes 637 within the PCB. Single-stub embodiments are also possible.

Figure 10:
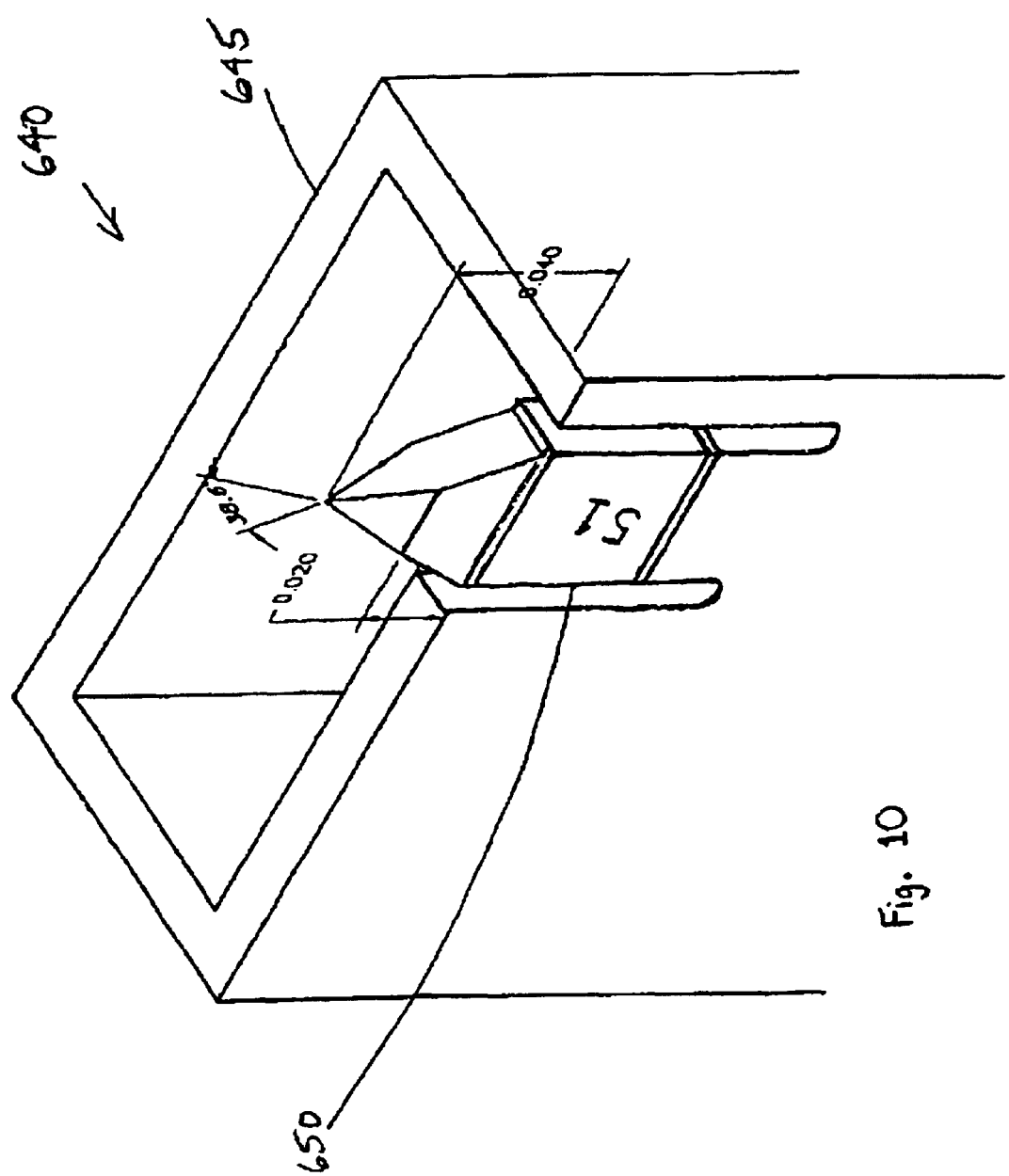
FIG. 10 shows an outer electrode assembly employing a lumped series resistance to improve step response time.

If it is desired to further improve probe speed, FIG. 10 shows a ground electrode assembly 640 comprising a lumped resistance in series with ground electrode 645, such that the step response time of the probe is shortened. This can be implemented employing surface mount resistor 650 (e.g., 51 ohms) or other resistance means.

Figure 11:
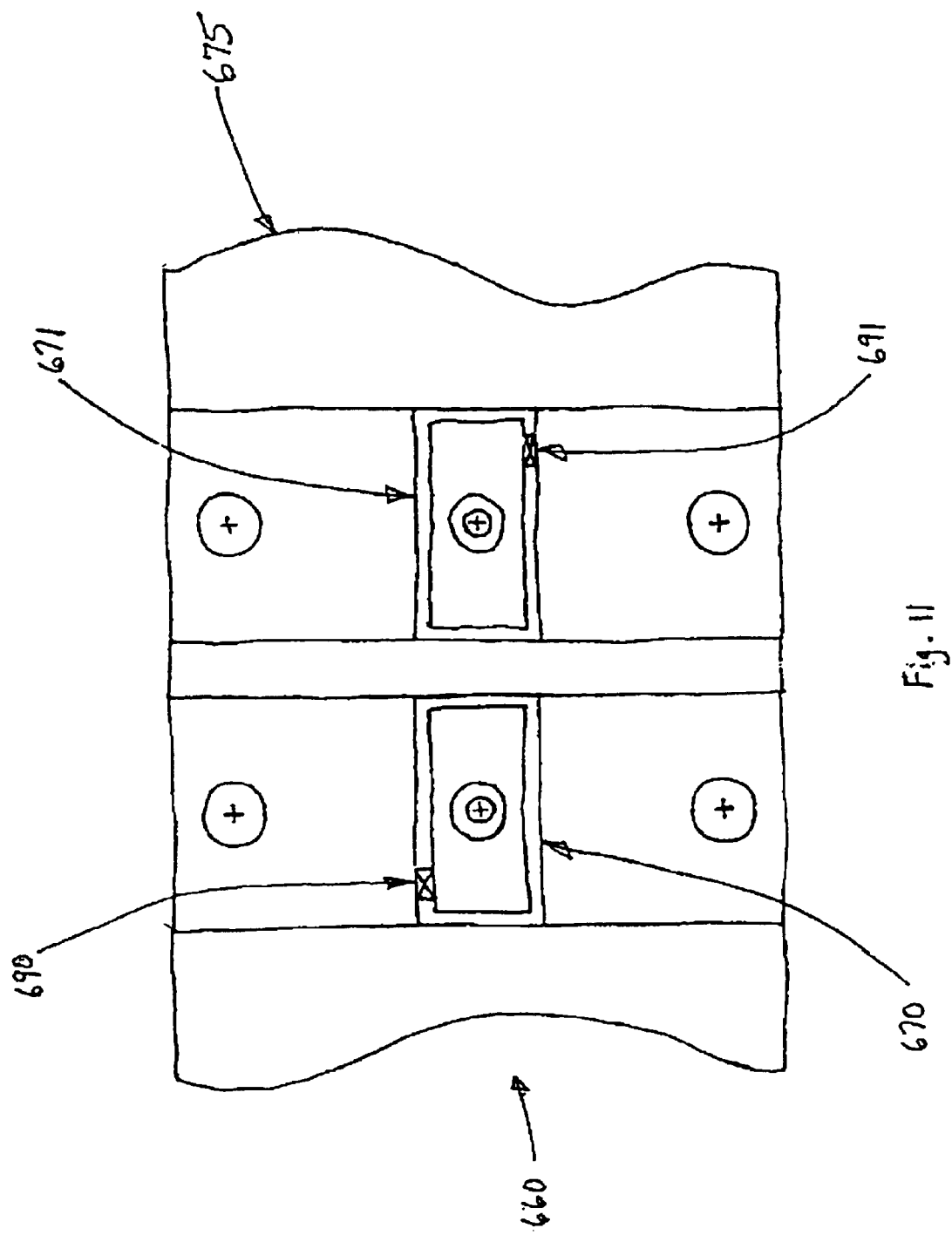
FIG. 11 illustrates an embodiment of a differential coaxial probe assembly with fixed probe-to-probe spacing.

FIG. 11 illustrates a differential passive coaxial probe assembly 660 comprising two probe assemblies 670, 671 mounted at a fixed spacing on the same mounting block 675. In another embodiment, two probe assemblies are mounted on two slotted or otherwise moveable probe mounts and on the same mounting plate such that the probe mounts are manually movable to produce variable spacing of the probe assemblies. In another embodiment, the probe mounts comprise conductive gears which are automatically movable via an electric motor or other means to produce variable spacing of the probe assemblies. For these differential configurations, it is preferred to have the position of the ground nib on each assembly 690, 691 mirrored with respect to each center conductor in order to balance axial test contact forces along the assembly center of mass.

Figure 12:
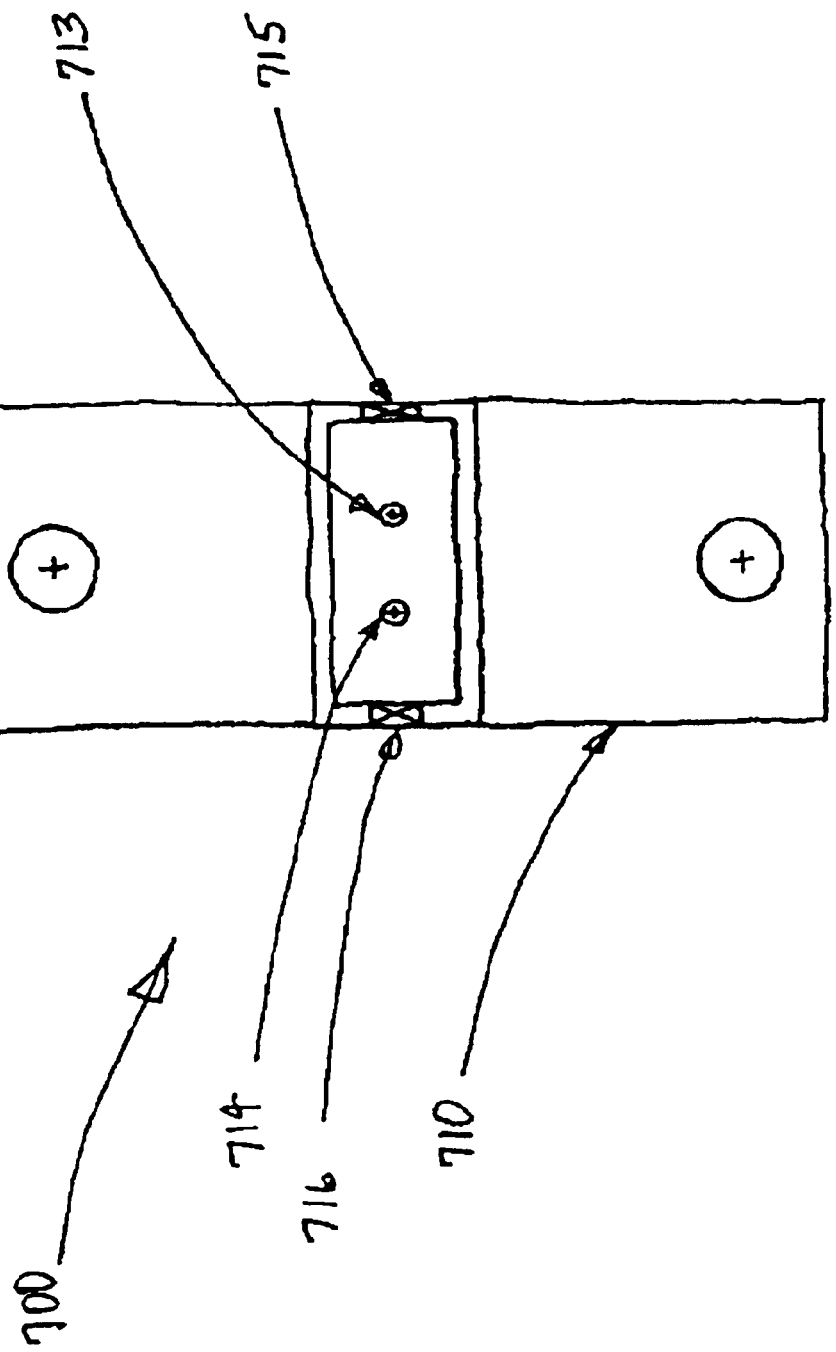
FIG. 12 shows a coupled line differential probe of the invention.

FIG. 12 shows a coupled line differential probe 700 comprising a single probe assembly 710 with two separately excited signal conductors 713, 714 and either one or two ground nibs 715, 716 on the outer conductor. In a variation of this embodiment, the outer conductor is void of ground nibs, such that the ground signal is not physically connected to the planar transmission line structure under test. In this arrangement, the transmission line under test is capacitively coupled to the nearest source of ground potential. This compact arrangement allows smaller pitches than those possible with the arrangement of FIG. 11. Impedance matches can be made for both odd (differential) and even (common) mode signal excitations.

Figure 13:
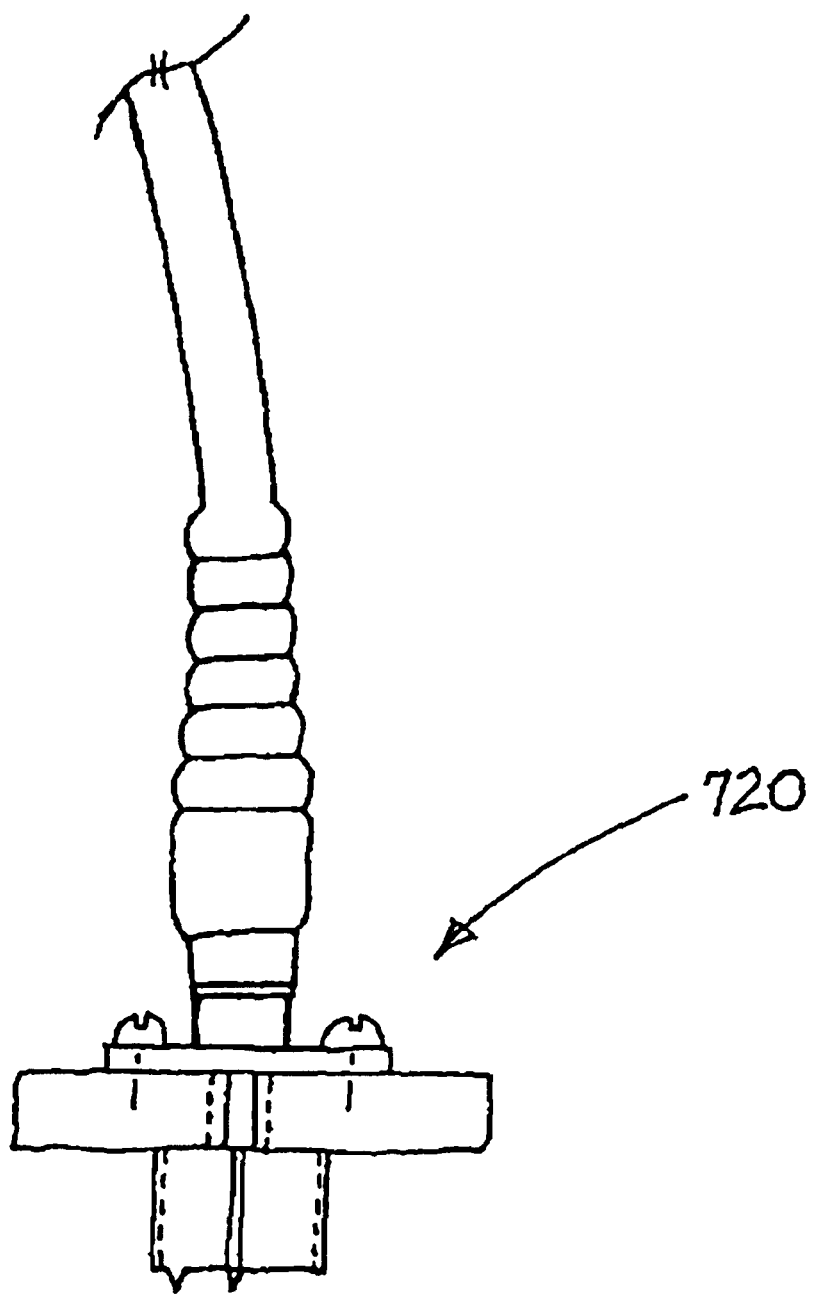
FIG. 13 illustrates a handheld probe assembly of the invention.

FIG. 13 illustrates a handheld probe assembly 720 according to the invention.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A coaxial probe for high frequency testing of planar electric transmission line structures, said probe comprising:
   a probe mount comprising a coaxial connector connected to a coaxial cable assembly;
   a center electrode mounted on said probe mount end electrically connected to a center conductor of said coaxial connector, wherein said center conductor may be placed in contact with a first point on a planar electric transmission line structure to be tested;
   a non-circular outer electrode mounted on said probe mount and electrically connected to ground, said outer electrode comprising a protrusion to be placed in contact with a second point on the planar electric transmission line structure to be tested wherein a pitch of said protrusion can be varied by affixing said protrusion on said outer electrode to match a pitch between the first point and the second point without affecting a characteristic impedance of the coaxial cable assembly, the coaxial connector and said probe mount; and
   a dielectric of non-uniform thickness between said center and said outer electrodes, wherein said coaxial probe is configured to match said characteristic impedance.

2. The probe of claim 1 wherein said probe mount comprises a conductive plate.

3. The probe of claim 2 wherein said dielectric comprises air.

4. The probe of claim 1 wherein said probe mount comprises a printed circuit board.

5. The probe of claim 4 wherein said dielectric comprises said printed circuit board and air.

6. The probe of claim 4 wherein said printed circuit board comprises one or more stubs for tuning electrical characteristics of said probe.

7. The probe of claim 6 wherein said printed circuit board additionally comprises one or more shorting bars located along said one or more stubs.

8. The probe of claim 1 wherein said outer electrode comprises a conductive tube having said non-circular cross-section.

9. The probe of claim 8 wherein said outer electrode has a cross-section selected from the group consisting of oval, square, rectangular, hexagonal, L-shaped, and U-shaped.

10. The probe of claim 1 wherein a pitch between said center electrode and said protrusion is fixed.

11. The probe of claim 1 wherein said protrusion comprises a tapered point.

12. The probe of claim 1 wherein said outer electrode is axially spring-loaded to provide compliance.

13. The probe of claim 1 wherein said connector is spring-loaded to provide compliance.

14. The probe of claim 13 wherein said connector is spring-loaded with a short-throw conductive spring.

15. The probe of claim 1 wherein said probe is handheld during testing of the planar electric transmission line structure.

16. The probe of claim 1 wherein said characteristic impedance of said probe substantially matches a coaxial cable characteristic impedance.

17. The probe of claim 1 wherein lumped series resistance is attached to said outer electrode, whereby speed of said probe is increased.

18. The probe of claim 17 wherein said probe comprises a resistor.

19. A differential coaxial probe assembly comprising two probes according to claim 1.

20. The probe of claim 1 wherein said outer electrode comprises an axially spring loaded conductor.

21. The probe of claim 1 wherein said coaxial connector comprises a resilient coaxial connector.

22. A coaxial probe for high frequency testing of planar electric transmission line structures, said probe comprising:
- a probe mount connected to a coaxial cable assembly;
- a center electrode mounted on said probe mount, wherein a center conductor may be placed in contact with a first point on a planar electric transmission line structure to be tested; and
- an outer electrode comprising a protrusion, wherein a pitch of said protrusion can be varied by affixing said protrusion on said outer electrode to match a pitch between the first point and a second point without affecting a characteristic impedance of the coaxial cable assembly, the coaxial connector and said probe mount, attached on a non-circular cross-section casing, wherein said coaxial probe is configured to match said characteristic impedance.

23. A differential coaxial probe assembly comprising two probes according to claim 22 with at least one one protrusion on a downward facing surface of each said outer electrode.

24. A differential coaxial probe assembly comprising two probes according to claim 22 with fixed relative positions.

25. A differential coaxial probe assembly comprising two probes according to claim 22 with manually variable relative positions.

26. A differential coaxial probe assembly comprising two probes according to claim 22 with automatically variable relative positions.

27. The probe of claim 22 wherein said outer electrode comprises an axially spring loaded conductor.

28. The probe of claim 22 wherein said coaxial connector comprises a resilient coaxial connector.

* * * * *